(12) United States Patent
Chi et al.

(10) Patent No.: US 11,715,758 B2
(45) Date of Patent: Aug. 1, 2023

(54) SUPER JUNCTION POWER DEVICE AND METHOD OF MAKING THE SAME

(71) Applicant: SiEn (QingDao) Integrated Circuits Co., Ltd., Shandong (CN)

(72) Inventors: Min-Hwa Chi, Qingdao (CN); Conghui Liu, Qingdao (CN); Huan Wang, Qingdao (CN); Longkang Yang, Qingdao (CN)

(73) Assignee: SiEn (QingDao) Integrated Circuits Co., Ltd., Qingdao (CN)

( * ) Notice: Subject to any disclaimer, the term of this patent is extended or adjusted under 35 U.S.C. 154(b) by 36 days.

(21) Appl. No.: 17/345,320

(22) Filed: Jun. 11, 2021

(65) Prior Publication Data

US 2021/0391417 A1    Dec. 16, 2021

(30) Foreign Application Priority Data

Jun. 12, 2020    (CN) .......................... 202010537282.4

(51) Int. Cl.
*H01L 29/06* (2006.01)
*H01L 29/417* (2006.01)
(Continued)

(52) U.S. Cl.
CPC .... *H01L 29/0634* (2013.01); *H01L 29/41766* (2013.01); *H01L 29/66734* (2013.01); *H01L 29/7813* (2013.01)

(58) Field of Classification Search
CPC .......... H01L 29/0634; H01L 29/41766; H01L 29/66734; H01L 29/7813; H01L 29/0623; H01L 29/0878; H01L 29/1095; H01L 29/417; H01L 29/66727; H01L 29/7397; H01L 29/0684; H01L 29/7802; H01L 29/0696; H01L 29/7375; H01L 29/7393–7395; H01L 29/66325;
(Continued)

(56) References Cited

U.S. PATENT DOCUMENTS

2017/0062556 A1*    3/2017    Takizawa ............ H01L 29/7813

* cited by examiner

*Primary Examiner* — Cuong B Nguyen
(74) *Attorney, Agent, or Firm* — Chen Yoshimura LLP

(57) ABSTRACT

The present invention provides a power device with super junction structure (or referred to as super junction power device) and a method of making the same. When making a super junction power device, impurity of a second conductive type may be implanted into an epitaxial layer of a first conductive type to form a floating island of the second conductive type and a pillar of the second conductive type successively through a super junction mask (or reticle) after forming the epitaxial layer of the first conductive type, directly through a well mask (or reticle) before or after forming a well of the second conductive type, and directly through a contact mask (or reticle) before or after forming a contact structure. Multiple epitaxial processes and deep trench etching process may not be needed. Therefore, the process is simple, the cost is low and yield and reliability are high. Because the super junction power device of the present invention has both the floating island of the second conductive type and the pillar of the second conductive type, in open state, a breakdown voltage may be raised and both Miller capacitance and input capacitance can be decreased and in on state, an on-state resistance can be decreased.

9 Claims, 10 Drawing Sheets

(51) Int. Cl.
*H01L 29/78* (2006.01)
*H01L 29/66* (2006.01)

(58) Field of Classification Search
CPC .......................... H01L 29/66333–66348; H01L 29/66234–66348; H01L 29/73–7378; H01L 29/739–7398; H01L 2924/1305–13056; H01L 21/8222–8229; H01L 21/8249; H01L 29/4236; H01L 29/42352; H01L 29/66613–66628
See application file for complete search history.

SUPER JUNCTION POWER DEVICE AND METHOD OF MAKING THE SAME

FIELD OF THE INVENTION

The present invention belongs to semiconductor device technology, and relates to a super junction power device and a method of making the same.

BACKGROUND OF THE INVENTION

In the field of power device, VDMOSFET (Vertical Double Diffused Metal Oxide Semiconductor Field Effect Transistor) is widely applied because of its advantages such as high operating frequency, good thermal stability and simple driving circuit. The two most important parameters for a power device among all are the breakdown voltage (BV) and on-resistance (Ron). A popular design of a power device on these two parameters is to provide high enough BV and low Ron as well to decrease power consumption.

Improvement of performance of a traditional power device was held back because of the tradeoff of BV and Ron on each other. Therefore, a super junction was introduced into a drift region of a traditional VDMOSFET to form a super junction structure in power MOSFET (referred to as SJMOS) to optimize the relation between BV and Ron to show advantages such as small Ron, fast turning on and low switch consumption which draw the industry's attention.

Current method of a super junction structure is generally formed by a deep trench etching process and a filling process in an epitaxial layer or formed by an epitaxial process and an implantation of doping in the epitaxial layer for multiple times so as to increase BV due to charge sharing effect. Then, the doping concentration of the epitaxial layer may be significantly increased at on-state to achieve lower Ron; the equivalent doping concentration in epi layer at off-state can be kept the same (due to the charge sharing effect) to achieve same BV. However, when the super junction is formed with the deep trench etching and filling process in the epitaxial layer, the deep trench may result in stress, poor defects and uniformity problems, and in turn degrading yield and reliability. The deeper the deep trench leads to larger aspect ratio of trench and more difficulty filling back and implant dose accuracy (for precision charge sharing) to achieve a higher BV. Additionally, the formation process is complicate and higher cost when the super junction is formed by performing multiple epitaxial and implant of doping in the epitaxial layer. Therefore, it is needed to provide a better super junction power device and method of making the same.

SUMMARY OF THE INVENTION

In light of above-mentioned drawbacks of the current technology, an object of the present invention is to provide a super junction power device and a method of making the same to solve the problems of stress, defect and uniformity and the problems of complicate processes and high cost.

To implement above-mentioned object and other related objects, the present invention provides a method of making a super junction power device, comprising steps of:

forming an epitaxial layer of a first conductive type;

forming trench gate structures in the epitaxial layer of the first conductive type, the trench gate structures comprising a gate oxide layer and a gate conductive layer;

through a well mask, forming a well of a second conductive type in the epitaxial layer of the first conductive type between the trench gate structures;

through a source mask, forming a source of the first conductive type in the well of the second conductive type;

through a contact mask, forming a contact structure passing through the source of the first conductive type and in mutual contact with the well of the second conductive type;

forming a floating island of the second conductive type, positioning in the epitaxial layer of the first conductive type, and a top surface and a bottom surface of the floating island of the second conductive type being in mutual contact with the epitaxial layer of the first conductive type;

forming a pillar of the second conductive type, positioning in the epitaxial layer of the first conductive type and right above the floating island of the second conductive type, and being in mutual contact with the well of the second conductive type.

Optionally, a super junction mask is used for implanting the doping impurity of the second conductive type into the epitaxial layer of the first conductive type to form the floating island of the second conductive type and the pillar of the second conductive type successively.

Optionally, before or after forming the well of the second conductive type, through the well mask, impurity of the second conductive type is implanted into the epitaxial layer of the first conductive type to form the floating island of the second conductive type and the pillar of the second conductive type successively.

Optionally, before or after forming the contact structure, through the contact mask, impurity of the second conductive type is implanted into the epitaxial layer of the first conductive type to form the floating island of the second conductive type and the pillar of the second conductive type successively.

Optionally, a thickness range of the epitaxial layer of the first conductive type between the formed floating island of the formed second conductive type and the pillar of the second conductive type is greater than 0.1 μm.

Optionally, the step of forming a contact structure may comprise:

through the contact mask, etching the source of the first conductive type and forming a contact trench passing through the source of the first conductive type;

through the contact mask, implanting impurity of the second conductive type into the c to form a contact region of the second conductive type;

through the contact mask, forming a metal contact region filling in the contact trench, and the metal contact region being in mutual contact with the contact region of the second conductive type.

Optionally, the first conductive type is n type, and the second conductive type is p type; or the first conductive type is p type, and the second conductive type is n type.

Optionally, the method may further comprise a step of forming a buffer layer of the first conductive type at the bottom surface of the epitaxial layer of the first conductive type.

Optionally, the method may further comprise a step of forming an implanted layer of the second conductive type at the bottom surface of the epitaxial layer of the first conductive type.

The present invention further provides a super junction power device, characterized by, the super junction power device comprising:

an epitaxial layer of a first conductive type;

a well of a second conductive type, positioning in the epitaxial layer of the first conductive type;

a source of the first conductive type, positioning in the well of the second conductive type;

trench gate structures, comprising a gate oxide layer and a gate conductive layer, the trench gate structures being positioned in the epitaxial layer of the first conductive type and passing through the source of the first conductive type and the well of a second conductive type;

a contact structure, passing through the source of the first conductive type and in mutual contact with the well of the second conductive type;

a floating island of the second conductive type, positioning in the epitaxial layer of the first conductive type, and a top surface and a bottom surface of the floating island of the second conductive type being in mutual contact with the epitaxial layer of the first conductive type;

a pillar of the second conductive type, positioning in the epitaxial layer of the first conductive type and right above the floating island of the second conductive type, and being in mutual contact with the well of the second conductive type.

Optionally, a width of the floating island of the second conductive type is the same as that of the pillar of the second conductive type.

Optionally, a thickness range of the epitaxial layer of the first conductive type between the floating island of the second conductive type and the pillar of the second conductive type is greater than 0.1 µm.

Optionally, the contact structure comprises a metal contact region, the metal contact region is positioned at a contact region of the second conductive type in the well of the second conductive type, passing through the source of the first conductive type and in mutual contact with the contact region of the second conductive type.

Optionally, the first conductive type is n type, and the second conductive type is p type; or the first conductive type is p type, and the second conductive type is n type.

Optionally, the super junction power device may further comprise a buffer layer of the first conductive type at the bottom surface of the epitaxial layer of the first conductive type.

Optionally, the super junction power device may further comprise an implanted layer of the second conductive type at the bottom surface of the epitaxial layer of the first conductive type.

As mentioned above, the super junction power device and the method of making the same of the present invention produce effects of:

When making a super junction power device, impurity of a second conductive type may be implanted into an epitaxial layer of a first conductive type to form a floating island of the second conductive type and a pillar of the second conductive type successively through adding a super junction mask after forming the epitaxial layer of the first conductive type, directly through a well mask before or after forming a well of the second conductive type, and directly through a contact mask before or after forming a contact structure. The conventional method by using multiple epitaxial growth and deep trench etching process may not be effective, the new method to form super junction structure is simple, the cost is low and the yield and reliability can be high.

The super junction power device of the present invention has both the floating islands of the second conductive type and the pillars of the second conductive type. In open state (or off-state), a breakdown voltage may be raised and both Miller capacitance and input capacitance may be decreased because both the floating islands of the second conductive type and the pillars of the second conductive type facilitate the charge sharing effect in a drift region of the epitaxial layer of the first conductive type. In on state, both the floating islands of the second conductive type and the pillars of the second conductive type can allow the drift region in the epitaxial layer of the first conductive type having higher doping concentration to significantly conduct a current and decrease an on-state resistance of a VDMOSFET device. Further, because the epitaxial layer of the first conductive type is positioned between the floating islands of the second conductive type and the pillars of the second conductive type, an additional triode (i.e. bipolar transistor) may be formed in the epitaxial layer of the first conductive type to further decrease the on-state resistance of a IGBT device.

Figure 1:
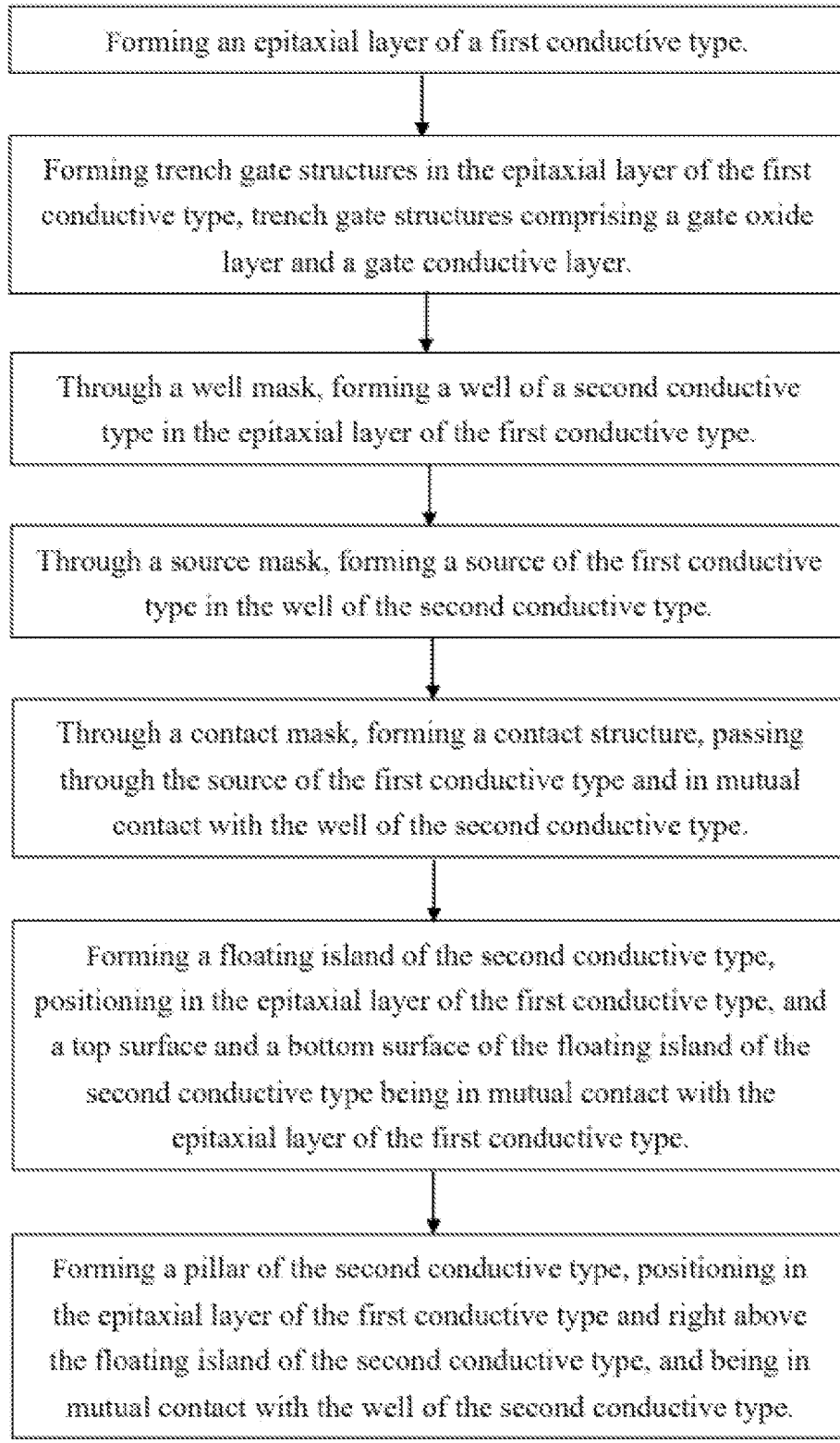
FIG. 1 shows a process flow chart of forming a super junction power device according to the present invention.

REFERENCE SIGNS 101, 201, 301 a substrate of a first conductive type
102, 202, 302 an epitaxial layer of the first conductive type
103, 203, 303 a well of a second conductive type
104, 204, 304 a source of the first conductive type
105, 205, 305 a contact structure
3051 a contact region of the second conductive type
3052 a metal contact region
106, 206, 306 a floating island of the second conductive type
107, 207, 307 a pillar of the second conductive type
108, 208, 308 a gate oxide layer
109, 209, 309 a gate conductive layer
110, 210, 310 an interlayer dielectric layer
111, 211, 311 a source metal layer
112, 212, 312 a drain metal layer 113, 213, 313 an implanted layer of the second conductive type 314 a buffer layer of the first conductive type

DESCRIPTION OF EMBODIMENTS OF THE INVENTION

Reference is now made to the following concrete examples taken in conjunction with the accompanying drawings to illustrate implementation of the present invention. Persons of ordinary skill in the art having the benefit of the present disclosure will understand other advantages and effects of the present invention. The present invention may be implemented with other examples. For various view or application, details in the present disclosure may be used for variation or change for implementing embodiments within the scope of the present invention.

Please refer to FIGS. 1 to 13. Please note that the drawings provided here are only for examples but not limited to the specific number or scale shown therein. When implementing the examples according to the drawings, condition, number and proportion of each element may be changed and arrangement of the elements may be in a more complex way.

Please refer to FIG. 1 for making a super junction power device, in which the steps of forming a floating island of a second conductive type and a pillar of the second conductive type may be optional, depending on actual needs, and embodiments may be illustrated below.

First Embodiment

Figure 2:
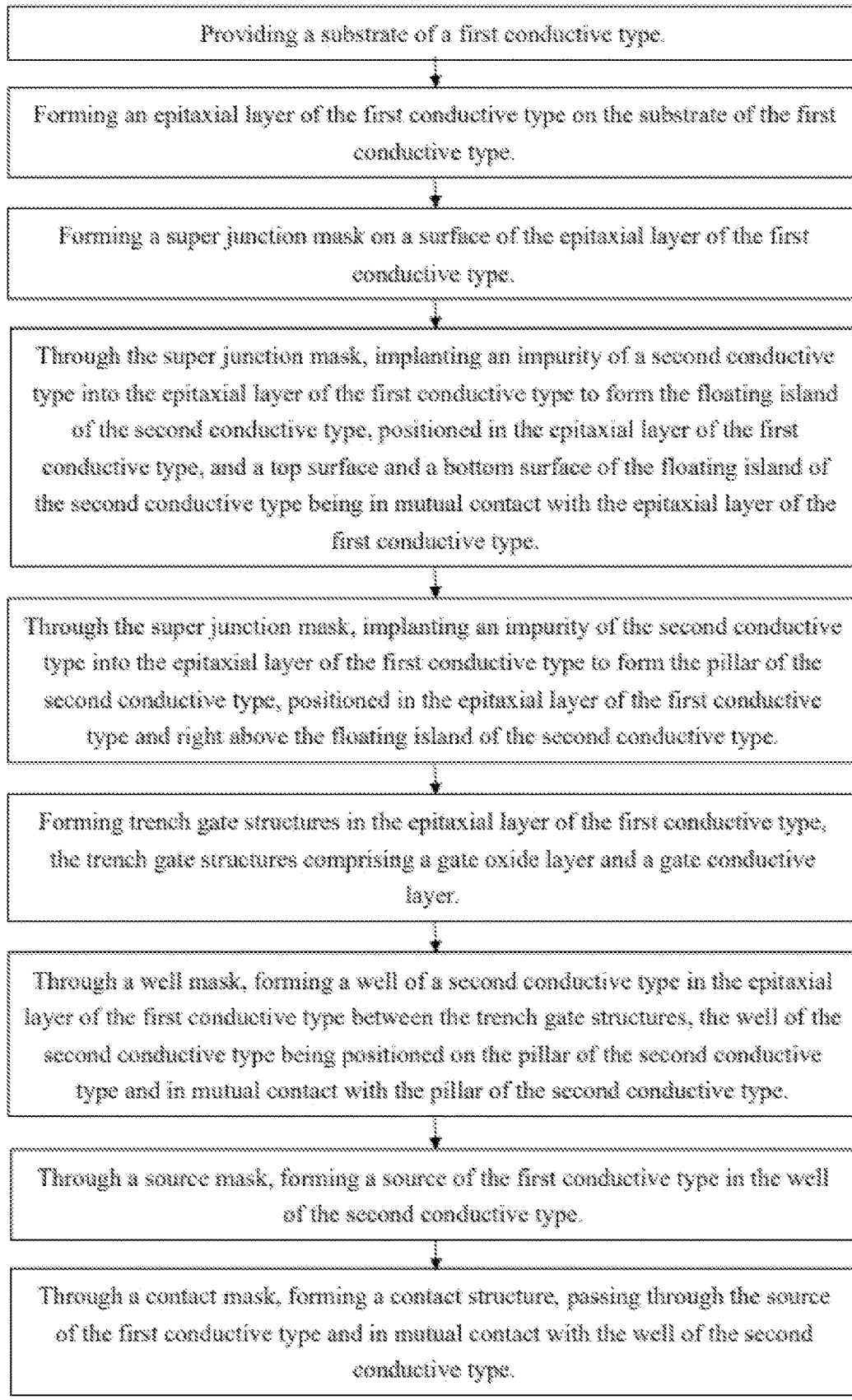
FIG. 2 shows a process flow chart of forming a super junction power device according to a first embodiment.

Please refer to FIG. 2 which shows a process flow chart of making a super junction power device having both the floating island of the second conductive type and the pillar of the second conductive type according to the present embodiment. Please also refer to FIGS. 3-5 for perspective views of a structure of the formed super junction power device.

In the present embodiment, impurity of a second conductive type may be implanted directly into an epitaxial layer of a first conductive type to form the floating island of the second conductive type and the pillar of the second conductive type with the same width successively through adding a super junction mask after forming an epitaxial layer of the first conductive type. Multiple epitaxial processes and deep trench etching process may not be needed. Therefore, the new process for forming super junction structure is simple, the cost is low, and the yield and reliability are high.

Please note that in the present embodiment the first conductive type is n type, and the second conductive type is p type, and in another embodiment the first conductive type may be p type, and the second conductive type may be n type. No more limitation is needed here.

According to FIG. 2, the formation process comprises steps of:

providing a substrate of a first conductive type 101;

forming an epitaxial layer of the first conductive type 102 on the substrate of the first conductive type 101;

forming a super junction mask on the surface of the epitaxial layer of the first conductive type 102;

through the super junction mask, implanting an impurity of a second conductive type in the epitaxial layer of the first conductive type 102 to form the floating island of the second conductive type 106, positioned in the epitaxial layer of the first conductive type 102, and a top surface and a bottom surface of the floating island of the second conductive type 106 being in mutual contact with the epitaxial layer of the first conductive type 102;

through the super junction mask, implanting an impurity of the second conductive type in the epitaxial layer of the first conductive type 102 to form the pillar of the second conductive type 107, positioned in the epitaxial layer of the first conductive type 102 and right above the floating island of the second conductive type 106;

forming trench gate structures in the epitaxial layer of the first conductive type 102, the trench gate structures comprising a gate oxide layer 108 and a gate conductive layer 109;

through a well mask, forming a well of a second conductive type 103 in the epitaxial layer of the first conductive type 102 between the trench gate structures, the well of the second conductive type 103 being positioned on the pillar of the second conductive type 107 and in mutual contact with the pillar of the second conductive type 107;

through a source mask, forming a source of the first conductive type 104 in the well of the second conductive type 103;

through a contact mask, forming a contact structure 105 passing through the source of the first conductive type 104 and in mutual contact with the well of the second conductive type 103.

Specifically, at first, the substrate of the first conductive type 101 is provided. The material of the substrate of the first conductive type 101 may be doped semiconductor materials such as silicon (Si), silicon-germanium (SiGe), gallium nitride (GaN) or silicon carbide (SiC).

Then, on the substrate of the first conductive type 101, the epitaxial layer of the first conductive type 102 is formed through epitaxial (epi) growth.

Then, the super junction mask is formed on the epitaxial layer of the first conductive type 102.

Specifically, on a surface of the epitaxial layer of the first conductive type 102, a layer of hard mask material may be deposited. The deposition may be performed with but not limited to chemical vapor deposition. The layer of hard mask material may be and not limited to a layer of silicon dioxide. Then, on a surface of the layer of hard mask material, both the floating island of the second conductive type 106 and the pillar of the second conductive type 107 may be formed through a lithography process, a dry etching process dry-etching the layer of hard mask material with a photoresist layer as etching mask that forms the super junction mask having the floating island of the second conductive type 106 and the pillar of the second conductive type 107.

Then, through the super junction mask, impurity of the second conductive type is implanted into the epitaxial layer of the first conductive type 102 to form the floating island of the second conductive type 106. Then, through the floating island of the second conductive type 106, when the power device is in open state (or off-state), the charge sharing effect of the drift region of the epitaxial layer of the first conductive type 102 can result in effectively reduced doping level, so as to raise the breakdown voltage and decrease both Miller capacitance and input capacitance of the power device. The floating island of the second conductive type 106 allows the drift region of the epitaxial layer of the first conductive type having higher doping concentration, so that the on-state resistance of the device can be lower.

Then, through the super junction mask, impurity of the second conductive type is implanted in to the epitaxial layer of the first conductive type 102 to form the pillar of the second conductive type 107. Through the pillar of the second conductive type 107, when the power device is in open state (or off-state), the charge sharing effect of the drift region of the epitaxial layer of the first conductive type 102 can result in effectively reduced doping level, so as to raise the breakdown voltage and decrease both Miller capacitance and input capacitance of the power device. The pillar of the second conductive type 107 allows the drift region of the epitaxial layer of the first conductive type having higher doping concentration, so that the on-state resistance of the device can be lower.

The sequence to form the floating island of the second conductive type 106 and the pillar of the second conductive type 107 may be inter-changeable. The doping concentration of the floating island of the second conductive type 106 and the pillar of the second conductive type 107 may be the same. The dopant may not be limited to B11. Because the floating island of the second conductive type 106 and the pillar of the second conductive type 107 are formed with the same super junction mask in the present embodiment, the floating island of the second conductive type 106 and the pillar of the second conductive type 107 have the same width.

In an example, a thickness range of the epitaxial layer of the first conductive type 102 between the formed floating island of the formed second conductive type 106 and the pillar of the second conductive type 107 is greater than 0.1 μm. A pnp triode (i.e. parasitic bipolar transistor) is formed between the formed floating island of the formed second conductive type 106 and the pillar of the second conductive type 107; this parasitic pnp bipolar structure may further reduce the on-state resistance of an IGBT device.

Then, the trench gate structure may be formed in the epitaxial layer of the first conductive type.

Specifically, the trench gate structure may eliminate unit area of the power device, in which the step of forming the trench gate structure may comprise:

etching the epitaxial layer of the first conductive type 102 to form gate trenches;

performing a thermal oxidation process to grow a layer of the gate oxide layer 108 covering a bottom and a side wall of the gate trenches on a surface of the gate trenches;

depositing polysilicon in the gate trenches to form the gate conductive layer 109;

wherein the trench gate structure may facilitate reduce unit area of the power device, the method of forming the trench gate structure may not be limited to what is disclosed here, a split gate may be chosen depending on the need, and process and structure may not be limited to what is disclosed here.

Then, through the well mask, the well of a second conductive type 103 was formed in the epitaxial layer of the first conductive type 102 between the trench gate structures. The well of a second conductive type 103 was positioned on the pillar of the second conductive type 107 and in mutual contact with the pillar of the second conductive type 107.

Then, through the source mask, the source of the first conductive type 104 is formed in the well of the second conductive type 103.

Then, through the contact mask, the contact structure 105 is formed passing through the source of the first conductive type 104 and in mutual contact with the well of the second conductive type 103.

Figure 3:
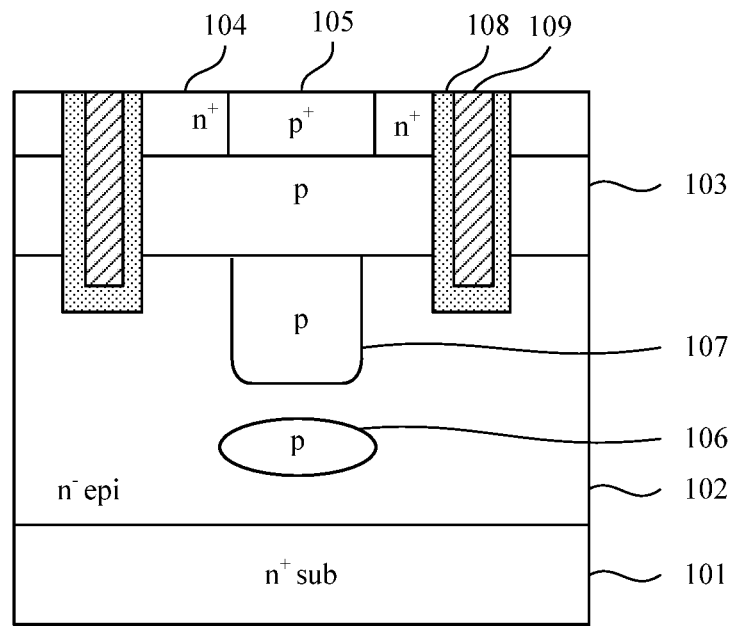
FIG. 3 shows a perspective view of a structure of a super junction power device according to the first embodiment.

Specifically, as shown in FIG. 3, in the present embodiment, the contact structure 105 is formed with implanting the impurity of the second conductive type in the well of the second conductive type 103 to form the short-circuit connection to the source of the first conductive type 104, but not limited to what is disclosed here. The contact structure 105 may be trench gate structure comprising a contact region of the second conductive type and a metal contact region. The contact region of the second conductive type may be positioned in the contact region of the second conductive type 103. The metal contact region, such as metal W, may be passing through the source of the first conductive type 104 in mutual contact with the contact region of the second conductive type. As such, the on-state resistance may be further reduced, and area for the contact structure may be reduced, compared with traditional planar contact structure. The trench gate structure will be introduced in a greater detail in the following embodiments.

Figure 4:
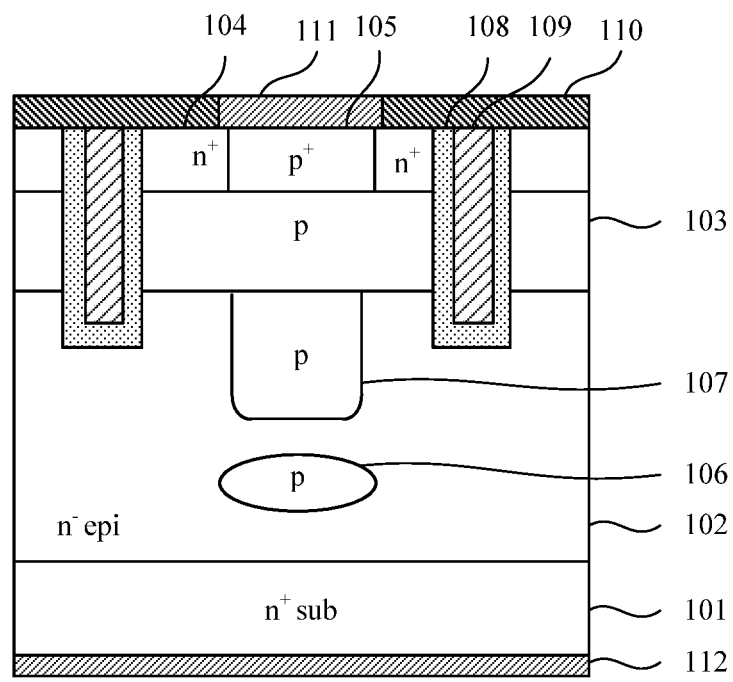
FIG. 4 shows a perspective view of a structure of a super junction VDMOSFET device according to the first embodiment.

Then, as shown in FIG. 4, more steps of forming an interlayer dielectric layer 110, a source metal layer 111 and a drain metal layer 112 may be comprised to form a VDMOSFET device, in which the order of the steps may be varied and the gate structure is known as planar type.

For example, one more step of forming a buffer layer of the first conductive type at the bottom surface of the epitaxial layer of the first conductive type 102 may be comprised.

Specifically, the doping concentration of the buffer layer of the first conductive type may be between that of the substrate of the first conductive type 101 and the epitaxial layer of the first conductive type 102 for achieving high BV; so as to avoid from the dopant atoms redistribution by a high temperature process. Therefore, the breakdown voltage of the super junction power device due to doping profile redistribution in the epitaxial layer of the first conductive type 102 may be prevented, and the problem of tail current during the devices witching off may also be solved with the substrate of the first conductive type 101.

Figure 5:
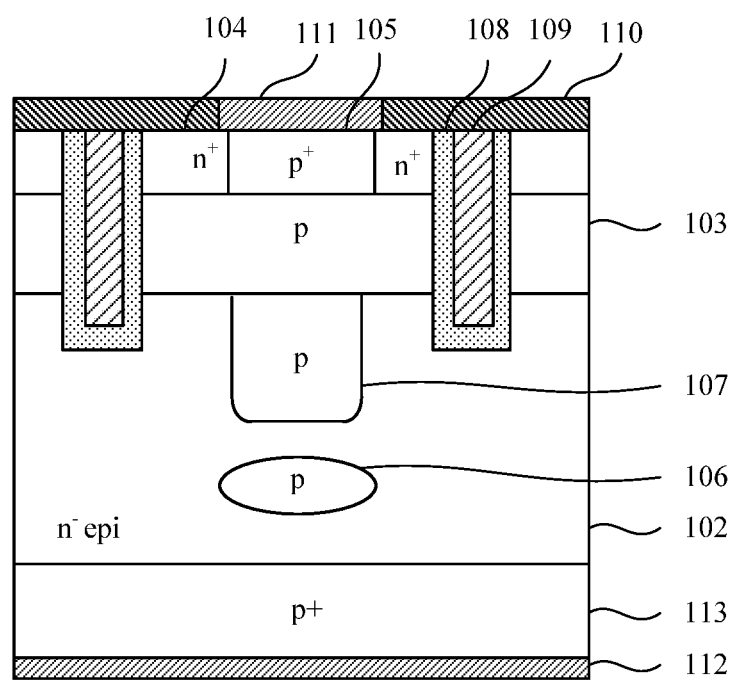
FIG. 5 shows a perspective view of a structure of a super junction IGBT device according to the first embodiment.

Please refer to FIG. 5. The present embodiment also provides a method of making an IGBT device. The difference between the method of making a VDMOSFET device in FIG. 4 and the method of FIG. 5 is an additional step of making an additional implanted layer of the second conductive type 113 between the drain metal layer 112 and the epitaxial layer of the first conductive type 102. Specifically, the substrate of the first conductive type 101 may be removed with the backside grinding or CMP and the implanted layer of the second conductive type 113 may be formed with but not limited to implanting the impurity of the second conductive type.

Please refer to FIG. 3. The present embodiment also provides a super junction power device, which may be made with but not limited to one of the aforesaid methods.

Specifically, the super junction power device may comprise the epitaxial layer of a first conductive type 102, the trench gate structures, the well of a second conductive type 103, the source of the first conductive type 104, a contact structure 105, the floating island of the second conductive type 106 and the pillar of the second conductive type 107, in which the well of a second conductive type 103 is positioned in the epitaxial layer of the first conductive type 102, the source of the first conductive type 104 is positioned in the well of the second conductive type 103, the trench gate structures are positioned in the epitaxial layer of the first conductive type 102, the trench gate structures comprise the gate oxide layer 108 and the gate conductive layer 109, and the trench gate structures are passing through the source of the first conductive type 104 and the well of a second conductive type 103; the contact structure 105 is passing through the source of the first conductive type 104 and in mutual contact with the well of the second conductive type 103, the floating island of the second conductive type 106 is positioned in the epitaxial layer of the first conductive type 102 and the top surface and the bottom surface of the floating island of the second conductive type 106 are in mutual contact with the epitaxial layer of the first conductive type 102, the pillar of the second conductive type 107 is positioned in the epitaxial layer of the first conductive type 102 and right above the floating island of the second conductive type 106 and in mutual contact with the well of the second conductive type 103, and the floating island of the second conductive type 106 and the pillar of the second conductive type 107 have the same width.

Because the super junction power device of the present invention has both the floating island of the second conductive type 106 and the pillar of the second conductive type 107, in open state (off state), both the floating island of the second conductive type 106 and the pillar of the second conductive type 107 may facilitate the charge sharing effect in the drift region of the epitaxial layer of the first conductive type 102, so as to raise the breakdown voltage of the device and decrease both Miller capacitance and input capacitance; and in on state, both the floating island of the second conductive type 106 and the pillar of the second conductive type 107 allow the drift region of the epitaxial layer of the first conductive type 102 having higher doping concentration to significantly increase current conducting and decrease an on-state resistance. The additional parasitic pnp bipolar structure in the epitaxial layer of the first conductive type 102 can further decrease the on-state resistance of a IGBT device.

For example, a thickness range of the epitaxial layer of the first conductive type 102 between the floating island of the second conductive type 106 and the pillar of the second conductive type 107 is greater than 0.1 µm, such as 1 µm, 5 µm.

For example, the contact structure 105 may comprise a metal contact region, the metal contact region may be positioned at a contact region of the second conductive type in the well of the second conductive type 103, passing through the source of the first conductive type 104 and in mutual contact with the contact region of the second conductive type.

For example, a buffer layer of the first conductive type may be formed at the bottom surface of the epitaxial layer of the first conductive type 102 to prevent from the redistribution of dopant atoms of the substrate of the first conductive type 101 diffusing into the epitaxial layer of the first conductive type 102 in a high temperature process through the buffer layer of the first conductive type. The buffer layer helps to prevent from the degradation of breakdown voltage of the super junction power device, and also solve the problem of tail current during device switching off.

For example, an implanted layer of the second conductive type may be formed at the bottom surface of the epitaxial layer of the first conductive type 102.

Specifically, as shown in FIG. 4, the VDMOSFET may be formed further with the interlayer dielectric layer 110, the source metal layer 111 and the drain metal layer 112. Please refer to FIG. 5, which shows that an additional implanted layer of the second conductive type 113 may be added between the drain metal layer 112 and the epitaxial layer of the first conductive type 102 to form an IGBT device. Further, the structure of the gate may not be limited to planar type, but also a trench type, or split gate.

Second Embodiment

Figure 6:
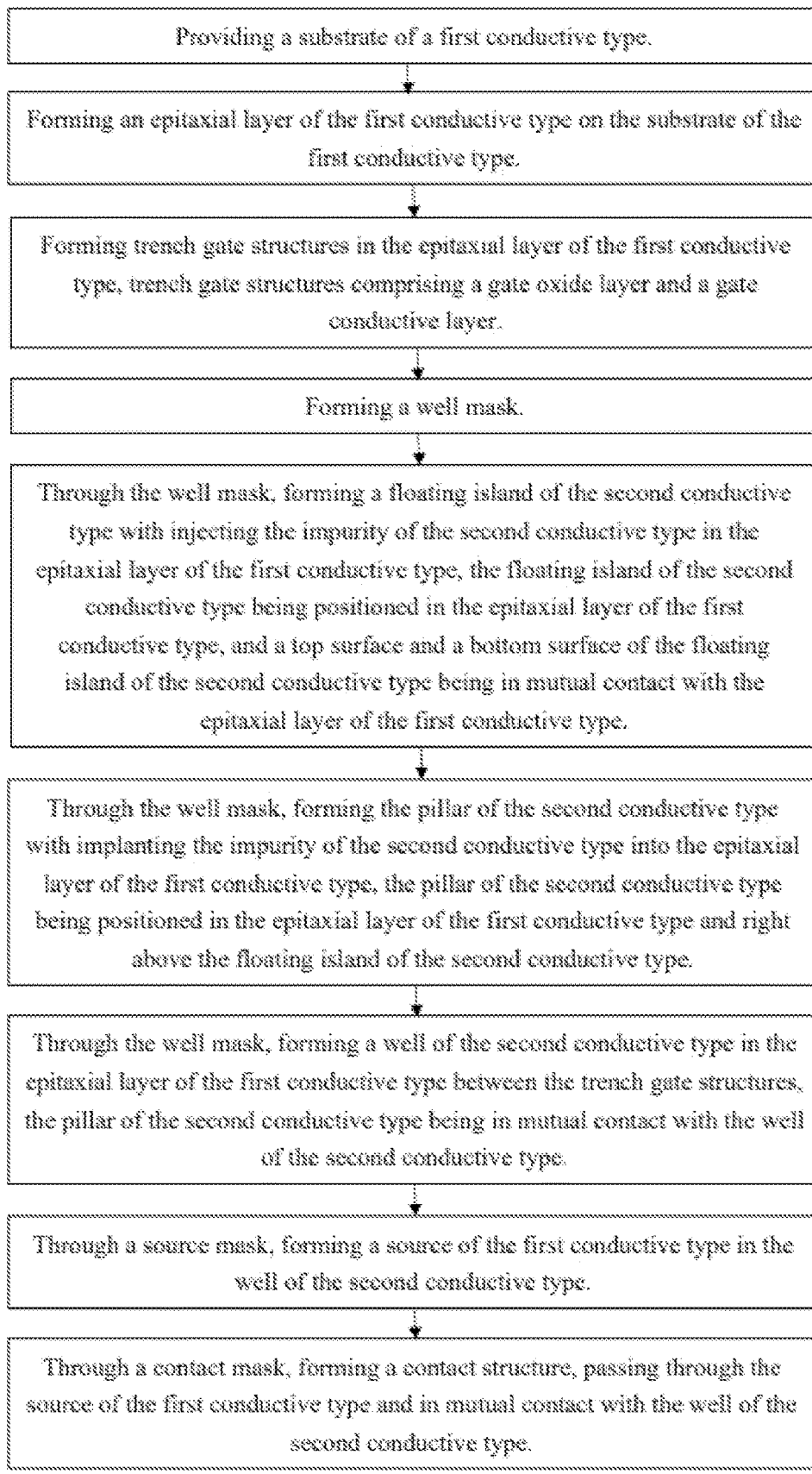
FIG. 6 shows a process flow chart of forming a super junction power device according to a second embodiment.
Figure 7:
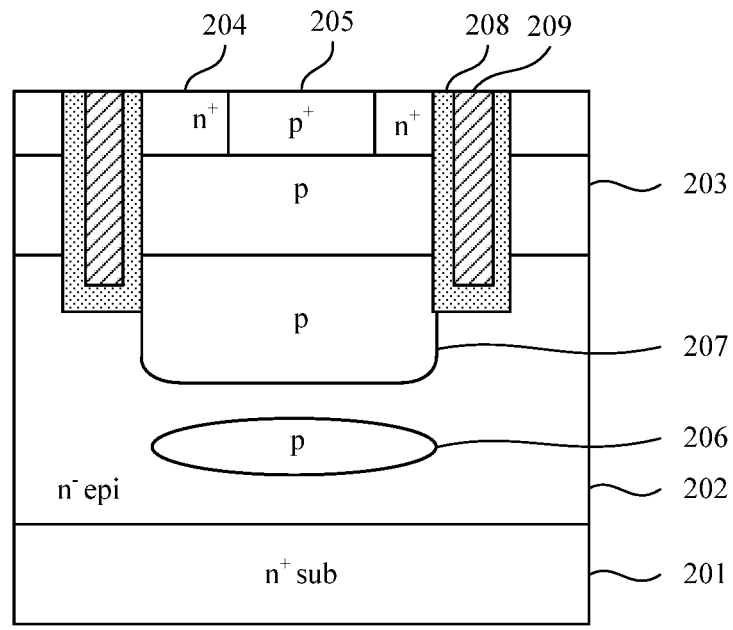
FIG. 7 shows a perspective view of a structure of a super junction power device according to a second embodiment.
Figure 8:
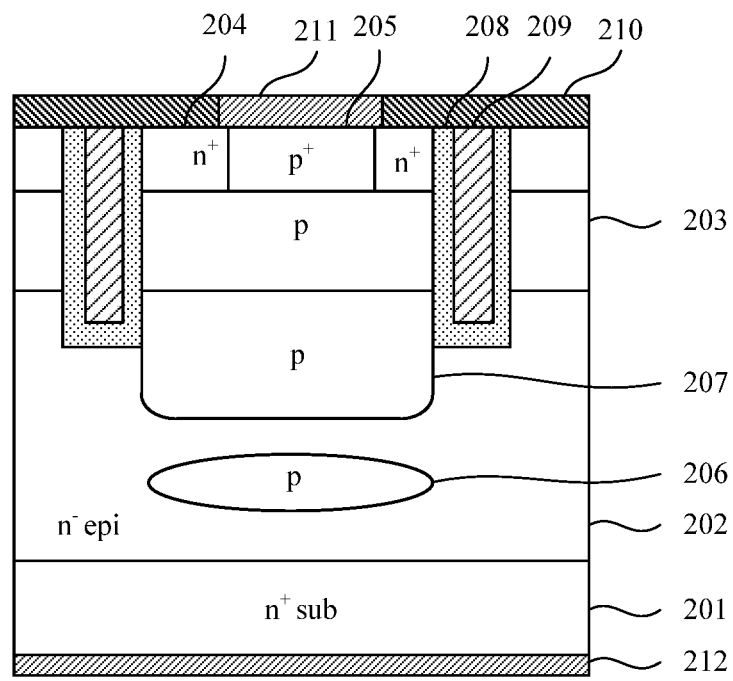
FIG. 8 shows a perspective view of a structure of a super junction VDMOSFET device according to the second embodiment.
Figure 9:
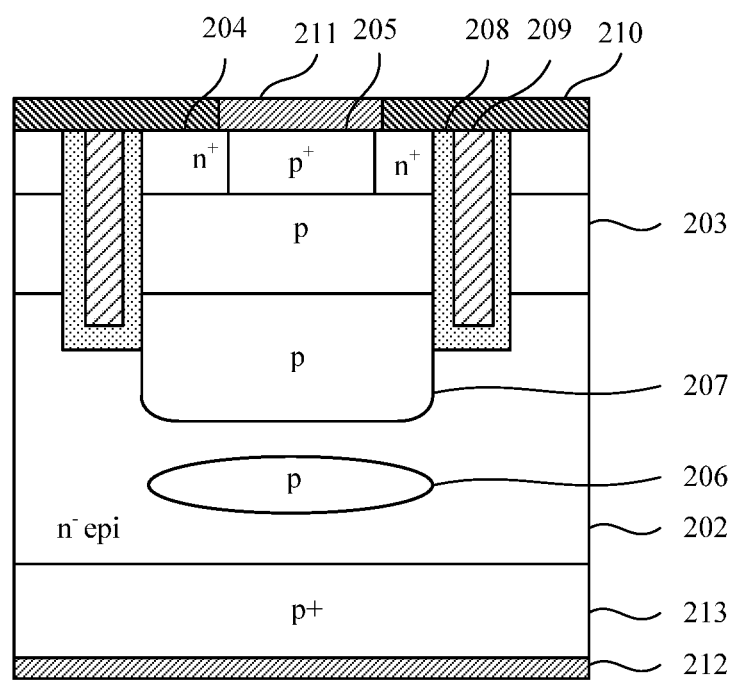
FIG. 9 shows a perspective view of a structure of a super junction IGBT device according to the second embodiment.

Please refer to FIG. 6. The present embodiment also provides a method of making another super junction power device, which has both the floating island of a second conductive type and a pillar of the second conductive type. FIGS. 7-9 show perspective views of a structure of the super junction power device. The difference between the first and second embodiments is that, in the present embodiment, impurity of the second conductive type may be implanted to an epitaxial layer of a first conductive type through a well mask before or after forming a well of the second conductive type to form the floating island of the second conductive type and the pillar of the second conductive type which have the same width as that of the well of the second conductive type successively.

In the present embodiment, directly through the well mask, the impurity of the second conductive type may be implanted into the epitaxial layer of the first conductive type to sequentially form the floating island of the second conductive type and the pillar of the second conductive type. No additional mask is needed either. Therefore, the formation process is simple, the cost is low and yield and reliability are high.

Please note that in the present embodiment, the first conductive type is n type, and the second conductive type is p type, and in another embodiment, the first conductive type may be p type, and the second conductive type may be n type.

Please refer to FIG. 6 which shows specific steps of the making process including:

providing a substrate of the first conductive type 201;

forming an epitaxial layer of the first conductive type 202 on the substrate of the first conductive type 201;

forming trench gate structures in the epitaxial layer of the first conductive type 202, the trench gate structures comprising a gate oxide layer 208 and a gate conductive layer 209;

forming a well mask;

through the well mask, forming the floating island of the second conductive type 206 with implanting the impurity of the second conductive type in the epitaxial layer of the first conductive type 202, the floating island of the second conductive type 206 being positioned in the epitaxial layer of the first conductive type 202, and a top surface and a bottom surface of the floating island of the second conductive type 206 being in mutual contact with the epitaxial layer of the first conductive type 202;

through the well mask, forming the pillar of the second conductive type 207 with implanting the impurity of the second conductive type in the epitaxial layer of the first conductive type 202, the pillar of the second conductive type 207 being positioned in the epitaxial layer of the first conductive type 202 and no deeper than the bottom of gate trench and right above the floating island of the second conductive type 206;

through the well mask, forming a well of the second conductive type 203 in the epitaxial layer of the first conductive type 202 between the trench gate structures, the well of the second conductive type 103 being in mutual contact with the pillar of the second conductive type 207;

through a source mask, forming a source of the first conductive type 204 in the well of the second conductive type 203;

through a contact mask, forming a contact structure 205, passing through the source of the first conductive type 204 and in mutual contact with the well of the second conductive type 203.

Specifically, through the trench gate structures, the unit area of the power device can be reduced. The trench gate structures may be split gate depending on the need and the forming process and structure may not be limited to what is disclosed here. the order to form the floating island of the second conductive type 206 and the pillar of the second conductive type 207 through the well mask may not be limited to the present embodiment. The order may be varied depending on the actual needs; for example, the second conductive type 206 and the pillar of the second conductive type 207 may be formed after forming the well of the second conductive type 203. Please refer to the first embodiment for the detailed function of the second conductive type 206 and the pillar of the second conductive type 207.

For example, a thickness range of the epitaxial layer of the first conductive type 202 between the formed floating island of the formed second conductive type 206 and the pillar of the second conductive type 207 is greater than 0.1 μm, such as 1 μm, 5 μm, but not limited to these values.

For example, the contact structure is formed by implanting the impurity of the second conductive type into the well of the second conductive type 203, so as to form a short-circuit connection to the source of the first conductive type 204. However, the contact structure is not limited to what is disclosed here, and the contact structure may be formed with trench type contact structure which will be introduced in the following embodiment.

Then, as shown in FIG. 8, more steps of forming an interlayer dielectric layer 210, a source metal layer 211 and a drain metal layer 212 may be comprised to form a VDMOSFET device. The order of these steps may be varied depending on actual need.

For example, one more step of forming a buffer layer of the first conductive type at the bottom surface of the epitaxial layer of the first conductive type 202 may be comprised.

Please refer to FIG. 9. The present embodiment also provides a method of making an IGBT device. The difference between the method of making a VDMOSFET device in FIG. 8 and the method of FIG. 9 is an additional step of making an additional implanted layer of the second conductive type 213 between the drain metal layer 212 and the epitaxial layer of the first conductive type 202. Specifically, the substrate of the first conductive type 201 may be removed with backside grinding or CMP and the implanted layer of the second conductive type 213 may be formed with but not limited to implanting the impurity of the second conductive type.

Please refer to FIG. 7. The present embodiment also provides a super junction power device, which may be made with but not limited to one of the aforesaid methods.

Specifically, the super junction power device may comprise the epitaxial layer of the first conductive type 202, trench gate structures, the well of the second conductive type 203, the source of the first conductive type 204, the contact structure 205, the floating island of the second conductive type 206 and the pillar of the second conductive type 207, in which the well of the second conductive type 203 is positioned in the epitaxial layer of the first conductive type 202 no deeper than the bottom of gate trench, the source of the first conductive type 204 is positioned in the well of a second conductive type 203, the trench gate structures are positioned in the epitaxial layer of the first conductive type 202, including the gate oxide layer 208 and the gate conductive layer 209, and passing through the source of the first conductive type 204 and the well of the second conductive type 203, the contact structure 205 is passing through the source of the first conductive type 204 and in mutual contact with the well of the second conductive type 203, the floating island of the second conductive type 206 is positioned in the epitaxial layer of the first conductive type 202 and the top surface and the bottom surface of the floating island of the second conductive type 206 are in mutual contact with the epitaxial layer of the first conductive type 202, the pillar of the second conductive type 207 is positioned in the epitaxial layer of the first conductive type 202 no deeper than the bottom of gate trench and right above the floating island of the second conductive type 206 and in mutual contact with the well of the second conductive type 203, and the floating island of the second conductive type 206 and the pillar of the second conductive type 207 have the same width as that of the well of the second conductive type 203.

For example, a thickness range of the epitaxial layer of the first conductive type 202 between the floating island of the second conductive type 206 and the pillar of the second conductive type 207 is greater than 0.1 μm, such as 1 μm, 5 μm, but not limited to these values.

For example, the contact structure 205 may comprise a metal contact region which is positioned at a contact region of the second conductive type in the well of the second conductive type 203, passing through the source of the first conductive type 204 and in mutual contact with the contact region of the second conductive type.

For example, a buffer layer of the first conductive type may be formed at the bottom surface of the epitaxial layer of the first conductive type 202.

For example, an implanted layer of the second conductive type may be formed at the bottom surface of the epitaxial layer of the first conductive type 202.

Specifically, as shown in FIG. 8, the VDMOSFET may be formed further with the interlayer dielectric layer 210, the source metal layer 211 and the drain metal layer 212. Please refer to FIG. 9, which shows that an additional implanted layer of the second conductive type 213 may be added between the drain metal layer 212 and the epitaxial layer of the first conductive type 202 to form the IGBT device. Further, the structure of the gate may not be limited to planar type, but also trench type or split gate.

Third Embodiment

Figure 10:
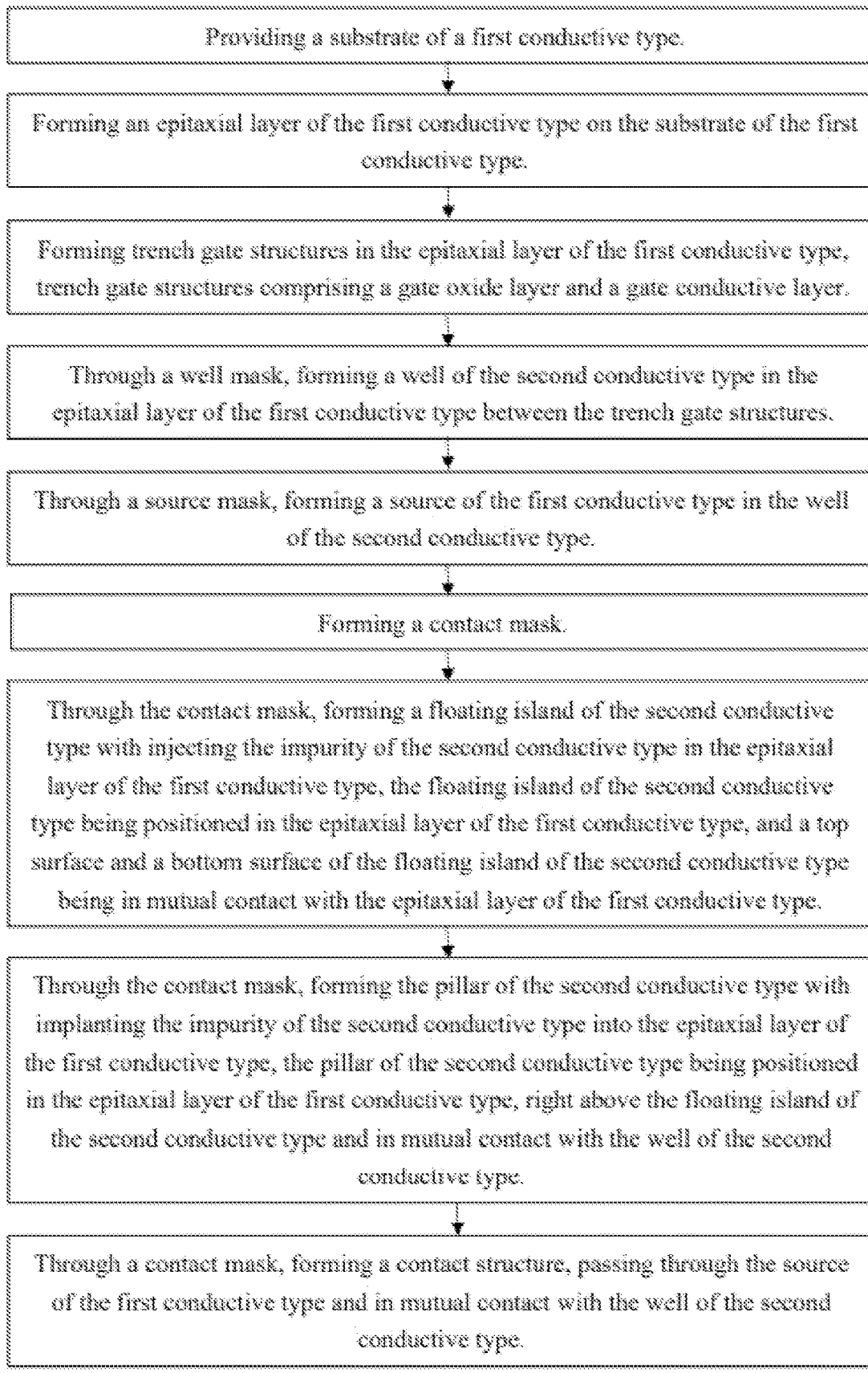
FIG. 10 shows a process flow chart of forming a super junction power device according to a third embodiment.

Please refer to FIG. 10. The present embodiment also provides a method of making yet another super junction power device, which has both a floating island of a second conductive type and a pillar of the second conductive type. FIGS. 10-13 show perspective views of a structure of the super junction power device. The difference between the first and second embodiments is that, in the present embodiment, impurity of the second conductive type may be implanted into an epitaxial layer of a first conductive type directly through a contact mask before or after forming a contact structure to form the floating island of the second conductive type and the pillar of the second conductive type which have the same width as that of the contact structure successively. The contact structure applies trench contact structures, i.e. comprising a contact region of the second conductive type and a metal contact region, and the buffer layer of the first conductive type is formed at a bottom surface of the epitaxial layer of the first conductive type.

In the present embodiment, the impurity of the second conductive type may be implanted directly to the epitaxial layer of the first conductive type to form the floating island of the second conductive type and the pillar of the second conductive type successively through the contact mask directly. No additional mask is needed either. Therefore, the formation process is simple, the cost is low and yield and reliability are high. Preferably, the floating island of the second conductive type and the pillar of the second conductive type may be formed after forming the contact mask and forming the contact structure to perform an anneal process for the floating island of the second conductive type and the pillar of the second conductive type simultaneously when performing an anneal step for the contact structure. As such, the complexity of process may be declined and the cost may be reduced.

Please note that in the present embodiment, the first conductive type is n type, and the second conductive type is p type, and in another embodiment, the first conductive type may be p type, and the second conductive type may be n type.

Please refer to FIG. 10 which shows specific steps of the making process including:

providing a substrate of the first conductive type 301;

forming an epitaxial layer of the first conductive type 302 on the substrate of the first conductive type 301;

forming trench gate structures in the epitaxial layer of the first conductive type 302, the trench gate structures comprising a gate oxide layer 308 and a gate conductive layer 309;

through a well mask, forming a well of the second conductive type 303 in the epitaxial layer of the first conductive type 302 between the trench gate structures;

through a source mask, forming a source of the first conductive type 304 in the well of the second conductive type 303;

forming the contact mask;

through the contact mask, forming a floating island of the second conductive type 306 with implanting the impurity of the second conductive type in the epitaxial layer of the first conductive type 302, the floating island of the second conductive type 306 being positioned in the epitaxial layer of the first conductive type 302, and a top surface and a bottom surface of the floating island of the second conductive type 306 being in mutual contact with the epitaxial layer of the first conductive type 302;

through the contact mask, forming the pillar of the second conductive type 307 with implanting the impurity of the second conductive type in the epitaxial layer of the first conductive type 302, the pillar of the second conductive type 307 being positioned in the epitaxial layer of the first conductive type 302, right above the floating island of the second conductive type 306 and in mutual contact with the well of the second conductive type 303;

through the contact mask, forming the contact structure 305, passing through the source of the first conductive type 304 and in mutual contact with the well of the second conductive type 303.

Specifically, through the trench gate structures, unit area of power devices may be reduced. The trench gate structure may be split gate structure but related process and structure are not limited to what is disclosed here.

Specifically, steps of forming the contact structure 305 may comprise:

through the contact mask, etching the source of the first conductive type 304 to form a contact trench passing through the source of the first conductive type 304;

through the contact mask, forming the contact region of the second conductive type 3051 with implanting of the impurity of the second conductive type in the well of the second conductive type 303;

through the contact mask, forming the metal contact region 3052 filling in the contact trench, the metal contact region 3052 being in contact with the contact region of the second conductive type 3051 2.

Specifically, the pillar of the second conductive type 307 is in mutual contact with the contact region of the second conductive type 3051, and the material of the metal contact region 3052 may be metal W to form the short-circuit connection to the source of the first conductive type 304 to further decrease the on-state resistance and reduce area of the contact structure, compared with traditional planar contact structure. Preferably, the floating island of the second conductive type and the pillar of the second conductive type may be formed after forming the contact mask and forming the contact structure 305, so as to perform an anneal process for the floating island of the second conductive type 306 and the pillar of the second conductive type 307 simultaneously when performing an anneal step for the contact region of the second conductive type 3051. As such, the complexity of process may be declined and the cost may be reduced. The order to form the floating island of the second conductive type 306 and the pillar of the second conductive type 307 through the contact mask may not be limited to the present embodiment. The order may be varied depending on the actual needs. Please refer to the first embodiment for the detailed function of the floating island of the second conductive type 306 and the pillar of the second conductive type 307.

For example, a thickness range of the epitaxial layer of the first conductive type 302 between the formed floating island of the formed second conductive type 306 and the pillar of the second conductive type 307 is greater than 0.1 μm, such as 1 μm, 5 μm, but not limited to these values.

Figure 12:
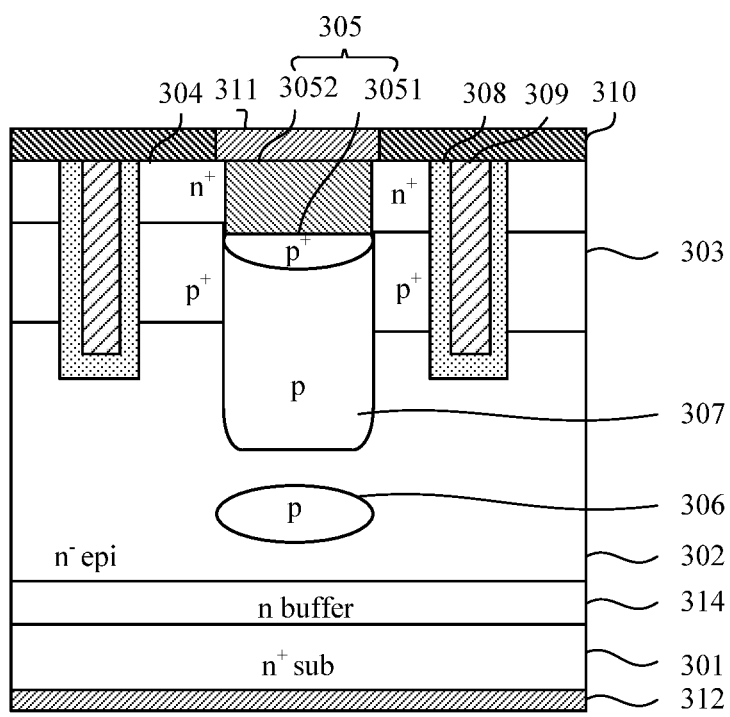
FIG. 12 shows a perspective view of a structure of a super junction VDMOSFET device according to the third embodiment.

Then, as shown in FIG. 12, more steps of forming an interlayer dielectric layer 310, a source metal layer 311 and a drain metal layer 312 may be comprised to form a VDMOSFET device, in which the order to perform the steps of forming the super junction power device may be not limited but depend on the actual needs.

For example, one more step of forming a buffer layer of the first conductive type 314 at the bottom surface of the epitaxial layer of the first conductive type 302 may be comprised. Specifically, through the buffer layer of the first conductive type 314, the dopant atoms of the substrate of the first conductive type 301 may be prevented from diffusion into the epitaxial layer of the first conductive type 302 in a high temperature process; therefore, breakdown voltage of the super junction power device is not degraded by the re-distribution of doping concentration of the epitaxial layer, The problem of tail current during device switching off may also be solved.

Figure 13:
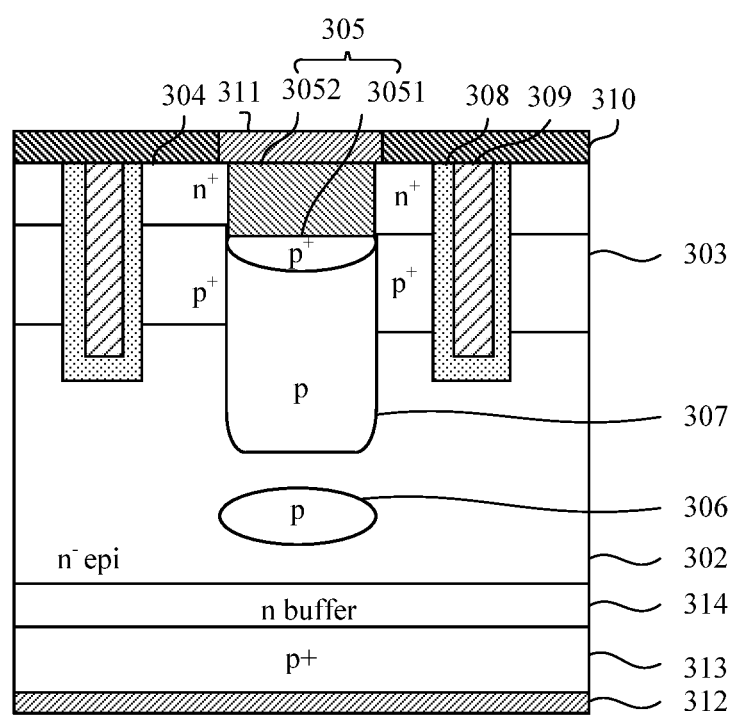
FIG. 13 shows a perspective view of a structure of a super junction IGBT device according to the third embodiment.

Please refer to FIG. 13. The present embodiment also provides a method of making an IGBT device. The difference between the method of making a VDMOSFET device in FIG. 12 and the method of FIG. 13 is an additional step of making an additional implanted layer of the second conductive type 313 between the drain metal layer 313 and the epitaxial layer of the first conductive type 302. Specifically, the substrate of the first conductive type 301 may be removed by backside grinding or CMP and the implanted layer of the second conductive type 313 may be formed with but not limited to implanting the impurity of the second conductive type.

Figure 11:
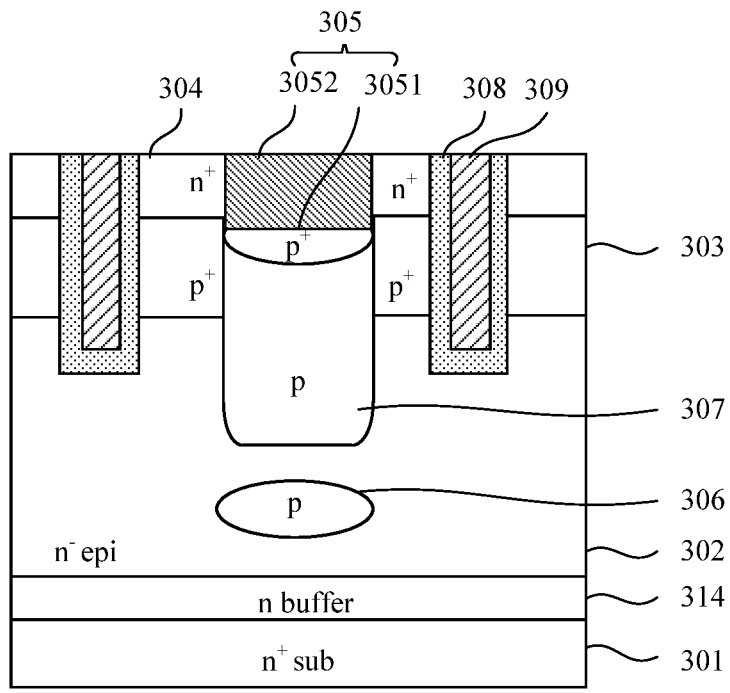
FIG. 11 shows a perspective view of a structure of a super junction power device according to the third embodiment.

Please refer to FIG. 11. The present embodiment also provides a super junction power device, which may be made with but not limited to one of the aforesaid methods.

Specifically, the super junction power device may comprise the epitaxial layer of the first conductive type 302, the trench gate structures, the well of the second conductive type 303, the source of the first conductive type 304, the contact structure 305, the floating island of the second conductive type 306 and the pillar of the second conductive type 307, in which the well of the second conductive type 303 is positioned in the epitaxial layer of the first conductive type 302, the source of the first conductive type 304 is positioned in the well of a second conductive type 303, the trench gate structures are positioned in the epitaxial layer of the first conductive type 302, including the gate oxide layer 308 and the gate conductive layer 309, and passing through the source of the first conductive type 304 and the well of the second conductive type 303, the contact structure 305 is passing through the source of the first conductive type 304 and in mutual contact with the well of the second conductive type 303, the floating island of the second conductive type 306 is positioned in the epitaxial layer of the first conductive type 302 and the top surface and the bottom surface of the floating island of the second conductive type 306 are in mutual contact with the epitaxial layer of the first conductive type 302, the pillar of the second conductive type 307 is positioned in the epitaxial layer of the first conductive type 302 and right above the floating island of the second conductive type 306 and in mutual contact with the well of the second conductive type 303, and the floating island of the second conductive type 306 and the pillar of the second conductive type 307 have the same width as that of the contact structure 305.

For example, the contact structure 305 may comprise a metal contact region 3052 which is positioned at a contact region of the second conductive type 3051 in the well of the second conductive type 303, passing through the source of the first conductive type 304 and in mutual contact with the contact region of the second conductive type 3051. The pillar of the second conductive type 307 is in mutual contact with the contact region of the second conductive type 3051.

For example, a thickness range of the epitaxial layer of the first conductive type 302 between the floating island of the second conductive type 306 and the pillar of the second conductive type 307 is greater than 0.1 μm, such as 1 μm, 5 μm, but not limited to these values, For example, a buffer layer of the first conductive type 314 may be formed at the bottom surface of the epitaxial layer of the first conductive type 302.

For example, an implanted layer of the second conductive type 313 may be formed at the bottom surface of the epitaxial layer of the first conductive type 302.

Specifically, as shown in FIG. 12, the VDMOSFET may be formed further with the interlayer dielectric layer 310, the source metal layer 311 and the drain metal layer 312. Please refer to FIG. 13, which shows that an additional implanted layer of the second conductive type 313 may be added between the drain metal layer 312 and the epitaxial layer of the first conductive type 302 to form the IGBT device. Further, the structure of the gate may not be limited to planar type, but also trench type or split gate.

To sum up, according to the super junction power device and the method of making the same of the present invention, when making a super junction power device, impurity of the second conductive type may be implanted into the epitaxial layer of the first conductive type to form the floating island of the second conductive type and the pillar of the second conductive type successively through adding a super junction mask after forming the epitaxial layer of the first conductive type, directly through the well mask before or after forming the well of the second conductive type, and directly through the contact mask before or after forming the contact structure. Therefore, the formation process is simple, the cost is low and yield and reliability are high. Because the super junction power device of the present invention has both the floating island of the second conductive type and the pillar of the second conductive type, in open state (off state), both the floating island of the second conductive type and the pillar of the second conductive type may facilitate charge sharing effect of the drift region of the epitaxial layer of the first conductive type, so as to raise the breakdown voltage and decrease both Miller capacitance and input capacitance; and in on state, both the floating island of the second conductive type and the pillar of the second conductive type allow the drift region of the epitaxial layer of the first conductive type having higher doping concentration to significantly increasing current conduction and decrease an on-state resistance of a VDMOSFET device, so as to form an additional parasitic bipolar transistor in the epitaxial layer of the first conductive type to further decrease the on-state resistance of a IGBT device.

It is to be understood that these embodiments are not meant as limitations of the invention but merely exemplary descriptions of the invention with regard to certain specific embodiments. Indeed, different adaptations may be apparent to those skilled in the art without departing from the scope of the annexed claims. In all instances, the scope of such claims shall be considered on their own merits in light of this disclosure, and such claims accordingly define the invention (s), and their equivalents or variations, that are protected thereby.

What is claimed is:

1. A method of making a super junction power device, characterized by, comprising:
   forming an epitaxial layer of a first conductive type;
   forming trench gate structures in the epitaxial layer of the first conductive type, the trench gate structures comprising a gate oxide layer and a gate conductive layer;
   through a well mask, forming a well of a second conductive type in the epitaxial layer of the first conductive type between the trench gate structures;
   through a source mask, forming a source of the first conductive type in the well of the second conductive type;
   through a contact mask, forming a contact structure passing through the source of the first conductive type and in mutual contact with the well of the second conductive type;
   forming a floating island of the second conductive type, positioning in the epitaxial layer of the first conductive type, and a top surface and a bottom surface of the floating island of the second conductive type being in mutual contact with the epitaxial layer of the first conductive type;
   forming a pillar of the second conductive type, positioning in the epitaxial layer of the first conductive type and right above the floating island of the second conductive type, and being in mutual contact with the well of the second conductive type.

2. The method of making the super junction power device according to claim 1, characterized by: wherein a super junction mask is formed on a surface of the epitaxial layer of the first conductive type after forming the epitaxial layer of the first conductive type, and through the super junction mask, impurity of the second conductive type is implanted into the epitaxial layer of the first conductive type to form the floating island of the second conductive type and the pillar of the second conductive type successively.

3. The method of making the super junction power device according to claim 1, characterized by: wherein before or after forming the well of the second conductive type, through the well mask, impurity of the second conductive type is implanted into the epitaxial layer of the first conductive type to form the floating island of the second conductive type and the pillar of the second conductive type successively.

4. The method of making the super junction power device according to claim 1, characterized by: wherein before or after forming the contact structure, through the contact mask, impurity of the second conductive type is implanted into the epitaxial layer of the first conductive type to form the floating island of the second conductive type and the pillar of the second conductive type successively.

5. The method of making the super junction power device according to claim 1, characterized by: wherein a thickness range of the epitaxial layer of the first conductive type between the floating island of the second conductive type and the pillar of the second conductive type is greater than 0.1 μm.

6. The method of making the super junction power device according to claim 1, characterized by: wherein the step of forming the contact structure comprises:

through the contact mask, etching the source of the first conductive type and forming a contact trench passing through the source of the first conductive type;

through the contact mask, implanting impurity of the second conductive type into the well of the second conductive type to form a contact region of the second conductive type;

through the contact mask, forming a metal contact region filling in the contact trench, and the metal contact region being in mutual contact with the contact region of the second conductive type.

7. The method of making the super junction power device according to claim 1, characterized by: wherein the first conductive type is n type, and the second conductive type is p type; or the first conductive type is p type, and the second conductive type is n type.

8. The method of making the super junction power device according to claim 1, characterized by: further comprising a step of forming a buffer layer of the first conductive type at the bottom surface of the epitaxial layer of the first conductive type.

9. The method of making the super junction power device according to claim 1, characterized by: further comprising a step of forming an implanted layer of the second conductive type at the bottom surface of the epitaxial layer of the first conductive type.

* * * * *